US008156621B2

(12) United States Patent
Iwai (10) Patent No.: US 8,156,621 B2
(45) Date of Patent: Apr. 17, 2012

(54) METHODS OF PRODUCING PIEZOELECTRIC VIBRATING DEVICES

(75) Inventor: Yu Iwai, Saitama (JP)

(73) Assignee: Nihon Dempa Kogyo, Ltd., Tokyo (JP)

( * ) Notice: Subject to any disclaimer, the term of this patent is extended or adjusted under 35 U.S.C. 154(b) by 773 days.

(21) Appl. No.: 12/005,549

(22) Filed: Dec. 26, 2007

(65) Prior Publication Data

US 2008/0209703 A1 Sep. 4, 2008

(30) Foreign Application Priority Data

Dec. 28, 2006 (JP) ................. 2006-354588

(51) Int. Cl.
*H01L 41/04* (2006.01)

(52) U.S. Cl. ............ 29/25.35; 29/594; 29/846; 310/370; 216/41; 216/44; 219/121.69

(58) Field of Classification Search ................. 29/25.35, 29/594, 846, 847; 310/348, 365, 367, 370; 216/41, 44; 438/734, 739; 219/121.68, 121.69
See application file for complete search history.

(56) References Cited

U.S. PATENT DOCUMENTS

| 4,472,654 | A | | 9/1984 | Nakamura et al. | |
|---|---|---|---|---|---|
| 6,046,531 | A | * | 4/2000 | Kikuchi et al. | 310/367 |
| 2005/0116586 | A1 | * | 6/2005 | Tanaya et al. | 310/348 |

FOREIGN PATENT DOCUMENTS

| JP | 57-166399 | | 10/1982 |
|---|---|---|---|
| JP | 02094911 | A * | 4/1990 |
| JP | 06/204776 | | 7/1994 |
| JP | 10-290135 | | 10/1998 |
| JP | 2000-323950 | | 11/2000 |
| JP | 2001-077647 | | 3/2001 |
| JP | 2001-326999 | | 11/2001 |
| JP | 2002-076806 | | 3/2002 |
| JP | 2002-261557 | | 9/2002 |
| JP | 2003-258331 | | 9/2003 |
| JP | 2003-318698 | | 11/2003 |
| JP | 2005-012767 | | 1/2005 |
| JP | 2005-094670 | | 4/2005 |
| JP | 2005-130105 | | 5/2005 |

OTHER PUBLICATIONS

Kandyla, et al., "Turning Aluminum Liquid in Picoseconds," OPN, p. 44, Dec. 2007.
Office Action, dated Aug. 18, 2011, issued in corresponding JP Application No. 2006-354588, filed Dec. 28, 2006.

* cited by examiner

*Primary Examiner* — A. Dexter Tugbang
(74) *Attorney, Agent, or Firm* — Klarquist Sparkman, LLP (57) ABSTRACT

The subject processes are for making piezoelectric vibrators, particularly those having a tuning-fork configuration. An exemplary process includes preparing a flat plate of piezoelectric crystal material exhibiting anisotropic etching properties. A corrosion-resistant film is formed on both major surfaces of the piezoelectric material. A first coating of photoresist is formed on the surfaces of the corrosion-resistant film. A lithographic exposure is performed of the pattern of a piezoelectric vibrating device on only one side of the piezoelectric plate. Then, the corrosion-resistant film, appearing unprotected on the one surface, is removed after developing the photoresist. A first etching is performed of the piezoelectric material appearing unprotected after removal of the corrosion-resistant film.

9 Claims, 8 Drawing Sheets

METHODS OF PRODUCING PIEZOELECTRIC VIBRATING DEVICES

CROSS-REFERENCE TO RELATED APPLICATION

This application claims priority to, and the benefit of, Japan Patent Application No. 2006-354588, filed on Dec. 28, 2006, the disclosure of which is incorporated herein by reference in its entirety.

FIELD

This disclosure relates to piezoelectric vibrators and resonators, to devices comprising same, and to methods for producing such devices. More particularly, the disclosure pertains to piezoelectric tuning-fork vibrators and resonators having outline patterns that have accurately formed side regions.

DESCRIPTION OF THE RELATED ART

Various prior-art consumer and industrial electronic devices such as timepieces, household electrical appliances, informational and communication devices, and office-automation devices include accurate time-keeping devices (clock sources). Such a time-keeping device usually includes a piezoelectric resonator, oscillator, or real-time clock module in which a piezoelectric vibrator and an IC chip are sealed in the same package. The piezoelectric resonator is coupled to electronic circuitry of the electronic device incorporating the resonator. In other applications, piezoelectric vibrators are used as gyroscopes for sensing rotational angular velocity as required for controlling the attitude and navigation of ships, aircrafts, automobiles, and the like. Gyroscopes based on piezoelectric vibrators are also used for detecting and preventing shake of video cameras and the like, and as rotating direction sensors, such as used in three-dimensional mice.

With reductions in the size and thickness of conventional electronic devices in which piezoelectric vibrators and resonators are mounted, corresponding reductions in the size and thickness of the piezoelectric vibrators and resonators are also required. The piezoelectric vibrators and resonators also usually must have a low CI (crystal impedance) value to achieve high-quality performance and high stability. To keep the CI value low, for example, piezoelectric tuning-fork resonators and vibrators have been developed of which the fork arms have recessed regions. Piezoelectric tuning-fork vibrators of this type are discussed in, for example, Japan Unexamined Patent Publication No. 2003-258331.

A conventional method for making a piezoelectric tuning-fork vibrator includes exposing a crystal wafer (made of a single-crystal piezoelectric material) by photolithography to form a photomask on the wafer. The masked material is soaked in a solution that etches the crystal material. Thus, an outline of the piezoelectric tuning-fork vibrator is formed by wet-etching. More specifically, a corrosion-resistant film is formed on the both surfaces of the crystal wafer. Then, a photoresist is coated on the corrosion-resistant film on both surfaces of the wafer and cured to form resist films. A pattern corresponding to the outline of the piezoelectric tuning-fork vibrator is arranged on the resist films, and both surfaces of the crystal wafer are exposed and developed.

Figure 8:
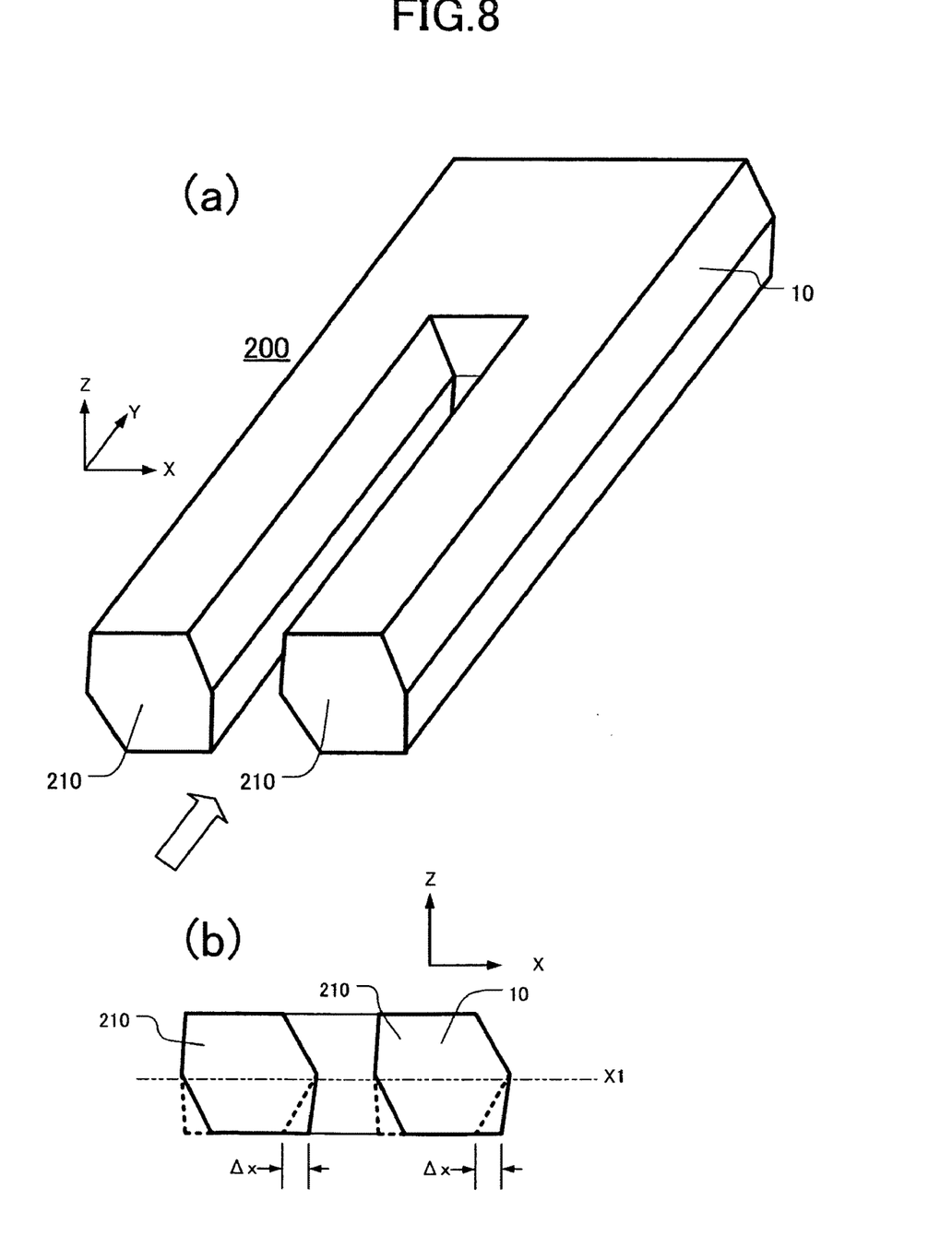
FIG. 8(a) is a perspective view of an embodiment of a piezoelectric tuning-fork vibrator after the single-crystal wafer has been wet-etched.
FIG. 8(b) is a sectional view, from the arrow side, of a pair of vibrating arms of a piezoelectric tuning-fork vibrator.

FIG. 8(a) is a perspective view of a piezoelectric tuning-fork vibrator 200, and FIG. 8(b) is an end view of its pair of arms 210, viewed in the direction of the large open arrow in FIG. 8(a). Whenever a pattern having the same profile is being exposed on both surfaces of the wafer, the pattern must be exposed at exactly the same positions on both surfaces without any misalignment or mis-registration of the pattern on one surface relative to the pattern on the other surface. If there is no misalignment, then the arms 210 have shapes as indicated by the symmetric cross-section along the X1-axis (horizontal dashed line in FIG. 8(b)). But, the very small size of the piezoelectric tuning-fork vibrator 200 makes it very difficult to achieve the needed precise positional alignment and registration using conventional methods. If the photomask is out of alignment by a distance ΔX, the cross-section of the arms will be asymmetric along the X1-axis, as indicated by the continuous bold lines below the axis X1 in FIG. 8(b). (Desired symmetry below the line X1 with structure above the line is indicated by the bold dashed lines below the line X1 in FIG. 8(b)). If the arm cross-sections are asymmetric, upon exciting the arms 210 to cause them to vibrate, the entire resonant structure (including the arms) acquires a twisting moment in the Y-direction. Such a moment causes the arms 210 to exhibit additional flexural vibrations in the X-direction while being vibrationally displaced in their thickness direction. These flexural vibrations may leak, thereby losing strain energy, which can generate unstable vibration characteristics.

To reduce these effects, exposure approaches, such as discussed in Japan Unexamined Patent Publication No. 2005-012767, have been proposed. The '767 application discusses using an etching metal layer as a mask after exposing and etching one surface of the metal layer. In the method discussed in the '767 application, a position-alignment step is eliminated, which prevents misalignments. However, sufficient exposure light does not pass through the crystal wafer from the photoresist layer on the upper surface of the wafer to the photoresist layer on the rear surface of the wafer. Consequently, the required exposure levels on both sides of the wafer are not achieved.

As disclosed herein, simple methods are provided for manufacturing piezoelectric tuning-fork vibrators and resonators of which the side regions have precise rectilinear sectional profiles, and of which front and rear surfaces are precisely registered with each other.

SUMMARY

To achieve the foregoing, and according to a first aspect, methods are provided for making piezoelectric vibrating devices. An embodiment of such a method comprises providing a flat plate of single-crystal piezoelectric crystal material that exhibits an anisotropic property. A corrosion-resistant film is formed on both major surfaces of the piezoelectric material. A first photoresist is applied on both surfaces of the corrosion-resistant film on both major surfaces. A pattern of a piezoelectric vibrator is exposed on the photoresist on one major surface of the plate. The exposed first resist is developed, and the corrosion-resistant film unprotected on the major surface is removed. A first etching is performed of the piezoelectric crystal material that is unprotected after removal of the corrosion-resistant film, to form the piezoelectric vibrator.

By exposing and etching of the piezoelectric material from one major surface, substantially no misalignment occurs of the patterns on both surface of the piezoelectric-crystal plate. Also, since the photoresist on the rear major surface of the crystal plate is not exposed from the front major surface, there is no concern with insufficient exposure light reaching the second major surface.

The process can further comprise a second exposure to form a pattern of the piezoelectric vibrating device in a tuning-fork shape having at least two vibratable arms. In an embodiment, after removing the corrosion-resistant film, a second coating of a photoresist is applied. A second exposure is performed to form a desired pattern in the second coating. The photoresist of the second coating is developed after performing the second exposure. A second etching of the piezoelectric material, appearing unprotected after removal of the corrosion-resistant film in the recessed regions, is performed. After the second etching, remaining resist and corrosion-resistant film can be removed.

The photoresist of the second coating can be used to define, for example, recesses or the like in the arms of the piezoelectric vibrator. The recesses are used to lower the CI value of the arms. In any event, the arms are exposed without misalignment and processed by etching. Etching can be wet or dry. Desirably, the arms are formed to exhibit flexural vibration only in the X-direction when excited.

Dry-etching can be performed instead of or after wet-etching. If the piezoelectric crystal material is a single crystal, and if the piezoelectric vibrator is configured having a tuning-fork shape, the lengthwise, widthwise, and thickness dimensions of the arms of the vibrator are oriented corresponding to the Y-axis, the X-axis, and Z-axis, respectively. During wet-etching, since the crystal has a high etch rate in the +X direction, the cross-section of the arms is formed asymmetrically by wet-etching. The anisotropic regions can be etched by dry-etching performed after the wet-etching step. Thus, the quality of etching configurations is increased. These etching steps also control the roughness of etched surfaces.

In another embodiment the first etching can be a wet-etch, followed by laser-trimming to side regions of the piezoelectric vibrator (particularly sides of the arms). To such end, a corrosion-resistant film and resist film can be formed on at least one major surface of the piezoelectric material. A laser light is irradiated on the piezoelectric material. The corrosion-resistant film and resist film prevent mis-exposures of the piezoelectric material by the laser beam during use of the beam to remove side regions of the piezoelectric vibrator. Whenever the outline of the piezoelectric vibrator is formed by wet-etching of a plate of piezoelectric material exhibiting etching anisotropy, the cross-section of the piezoelectric vibrator is asymmetric, yielding portions of the sides being excessively projecting in an asymmetric manner. This asymmetry of the cross-section can be resolved or improved by removing projecting portions of the sides using a laser light. Thus, the arms of the piezoelectric vibrator can be formed that do not yield losses of deformation energy by vibrating leakage and that enables repeated stable movements during vibration. It is alternatively possible to form the outline of the piezoelectric vibrator using laser cutting, without being preceded by wet-etching. However, such a method requires large amounts of time. On the other hand, in the method involving wet-etching followed by laser trimming, productivity is much higher because only the asymmetric portions of the sides of the arms are processed by the laser light.

During irradiation using laser light, it is desirable that the piezoelectric vibrator have a protective cover. The cover prevents adverse consequences of a situation in which the laser light is irradiated on the surface of the piezoelectric material that is unprotected by the corrosion-resistant film and resist film. In other words, use of a protective mask on the piezoelectric vibrator during exposure to the laser beam prevents production of defective product. Even in situations in which the corrosion-resistant film and resist film still remain on the surface of the piezoelectric material, the piezoelectric vibrator can be protected using a protection mask to prevent damage that otherwise could arise by accidental exposure of certain regions to the laser light.

The laser light used in the method embodiments summarized above desirably is a pulsed laser beam having a pulse-width in the femtosecond range. Femtosecond laser pulse-widths enable accurate laser trimming to be performed without generating excess heat by multi-photon absorption into the structure of the piezoelectric vibrator. Heating prevention is especially important when fabricating piezoelectric vibrators sized less than a few millimeters.

The second etching step noted above (for forming recesses and the like) can be wet-etching or dry-etching. Etching anisotropy of the recesses, produced by wet-etching, has a relatively small influence on vibration of the arms, especially if etched from both sides. Thus, piezoelectric vibrators in which recesses are made by wet etching exhibit a stable vibrating characteristic.

Piezoelectric vibrators and packaged piezoelectric devices including such vibrators, made by methods as disclosed herein, are of high quality. They resist losses of deformation energy by vibration leakage and exhibit repeatable and stable curvature movements during vibration.

The various embodiments of methods as disclosed herein produce piezoelectric vibrators having side surfaces that are formed correctly. It is unnecessary in these embodiments to fit the positions of photomasks on both surfaces of the crystal wafer. Also, even though wet-etching can be used to form the outline of the piezoelectric vibrator on an anisotropic crystal material, reduced asymmetric diversity of the cross-section of the vibrator is nevertheless achieved.

The embodiments of present invention are explained with the following figures.

BRIEF DESCRIPTION OF THE DRAWINGS

FIG. 2(a) is a perspective view of an embodiment of a piezoelectric device comprising a piezoelectric tuning-fork vibrator.

FIG. 2(b) is a sectional view, and FIG. 2(c) is a top plan view (with metal cap removed) of the device shown in FIG. 2(a).

DESCRIPTION OF THE PREFERRED EMBODIMENTS

Exemplary Configuration of a Piezoelectric Tuning-Fork Vibrator

Figure 1:
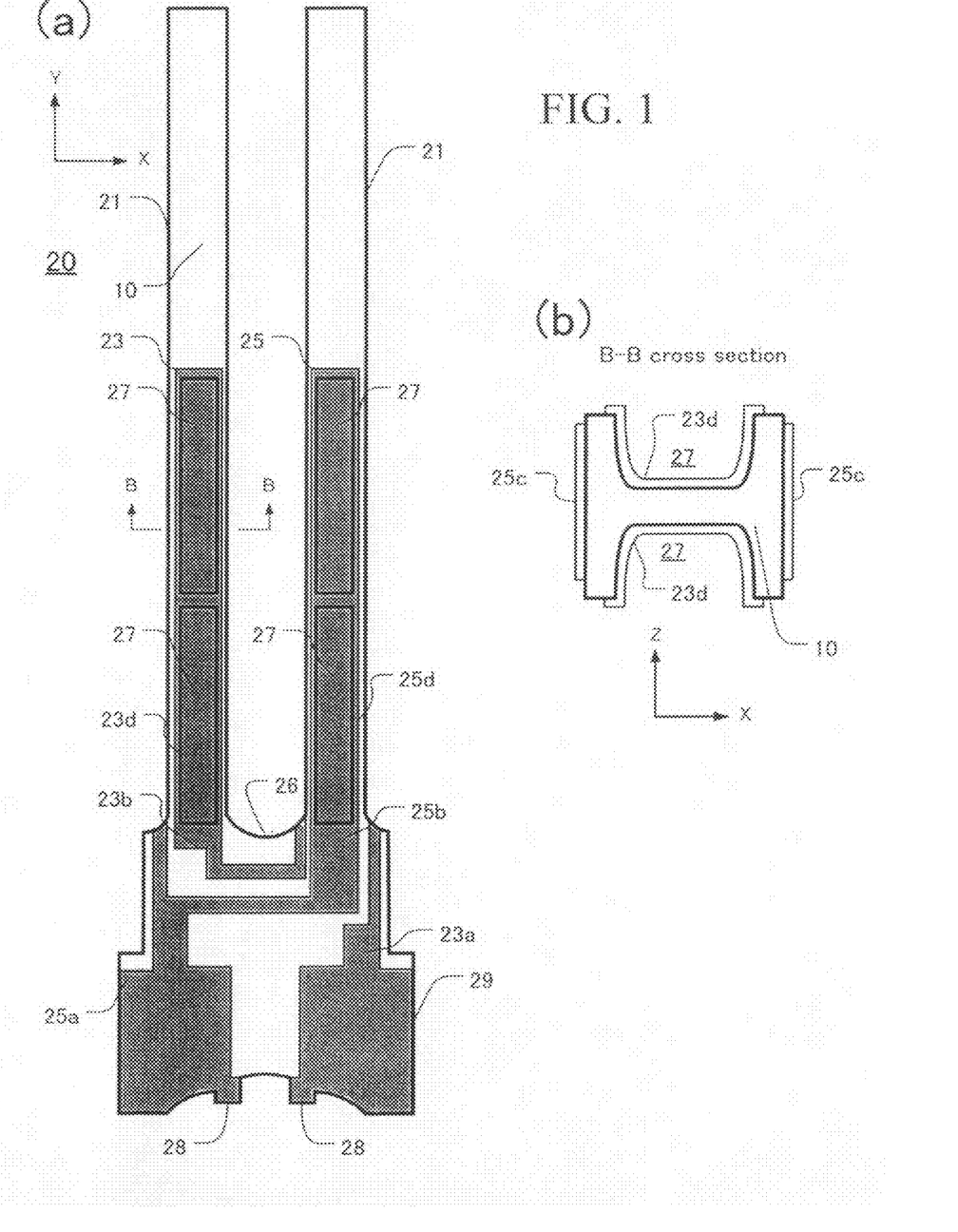
FIG. 1(a) is an enlarged plan view of an embodiment of a piezoelectric tuning-fork resonator (also called a piezoelectric tuning-fork vibrator).
FIG. 1(b) is a sectional view along the line B-B in FIG. 1(a).

FIG. 1(a) is a plan view showing the structure of a piezoelectric tuning-fork crystal vibrator 20. FIG. 1(b) is a sectional view, along the line B-B of FIG. 1(a), of one vibrating arm 21 of the device 20. The material from which the piezoelectric tuning-fork vibrator 20 is made is a piezoelectric crystal (e.g., quartz) wafer 10. As shown in FIG. 1(a), the device 20 comprises a base portion 29 and a pair of arms 21 extending in a forked manner from the base portion 29. The arms 21 extend in parallel, upward in FIG. 1(a), and are configured to achieve a required high level of performance in a small size. The region 26 at the base portion 29, between the arms 21, is tapered or curved to minimize changes and variations of the resonant frequency of the arms that could result from changes in ambient temperature. The shape of the region 26 may be either U-shaped as shown or V-shaped, for example.

Embodiments are described herein based on the piezoelectric tuning-fork crystal vibrator 20 comprising a pair of arms 21 that vibrate. However, the same principles are applicable to piezoelectric tuning-fork crystal vibrators 20 that comprise three or four vibrating arms 21.

The piezoelectric tuning-fork crystal vibrator 20 is small. Vibration of the arms 21 produces a signal having a frequency of 32.768 KHz, for example. Such arms 21 are, for example, approximately 1.7 mm long and approximately 0.5 mm wide. Desirably, recesses 27 are defined on both the front (facing) and reverse surfaces of the arms 21. In this embodiment two recesses 27 are formed on the front surface of each arm 21, and two recesses 27 (not visible) are formed on the reverse surface of each arm 21. In other words, the arms 21 in this embodiment include eight recesses 27. Each recess 27 of this embodiment has a depth of approximately 35% to approximately 45% of the thickness of the piezoelectric crystal wafer 10. Because the recesses are on both the front and reverse sides of each arm 21, the cross-section of each arm in the region of the recesses 27 is approximately H-shaped. The recesses 27 prevent unwanted increases in the crystal impedance (CI) value.

The base portion 29 of the piezoelectric tuning-fork crystal vibrator 20 is plate-like in configuration. The length of the base portion 29 is approximately 36% of the length of an arm 21. At the lower end of the device vibrator 20, the base portion 29 comprises a pair of joint tabs 28. The joint tabs 28 keep the vibrator 20, as shown in FIG. 1(a), connected to the crystal wafer 10 as the vibrator is being formed from the crystal wafer 10 by photolithography and etching.

A first electrode 23 and a second electrode 25 are formed on the arms 21 and basal portion 29. Each of the first electrode 23 and the second electrode 25 comprises a first layer (underlayer) of chromium (Cr) having a thickness of 150-5000 Ångstroms and a second layer of gold (Au) layer having a thickness of 100-5000 Ångstroms formed on the first layer. In other words, the thickness of each electrode (the combined thickness of the first and second layers) is in the range of 250-10,000 Ångstroms. Alternatively, the first layer (underlayer) may comprise tungsten (W), nickel (Ni), or tungsten-nickel instead of chromium (Cr), and the second layer may comprise silver (Ag) instead of gold (Au). Further alternatively, an electrode 23, 25 may consist of only one layer selected from aluminum (Al), copper (Cu), and silicon (Si).

Referring to FIG. 1(a), a first base-portion electrode 23a and a second base-portion electrode 25a are formed on the base portion 29 of the piezoelectric tuning-fork crystal vibrator 20. A first recess electrode 23d and a second recess electrode 25d are formed in and around the recesses 27 of the arms 21, respectively. Referring to FIG. 1(b), a second side-surface electrode 25c is formed on each side surface of the left arm 21 in FIG. 1(a), and a first side-surface electrode 23c is formed on each side surface of the right arm 21 (not shown).

Exemplary Configuration of a Piezoelectric Crystal Resonator

Figure 2:
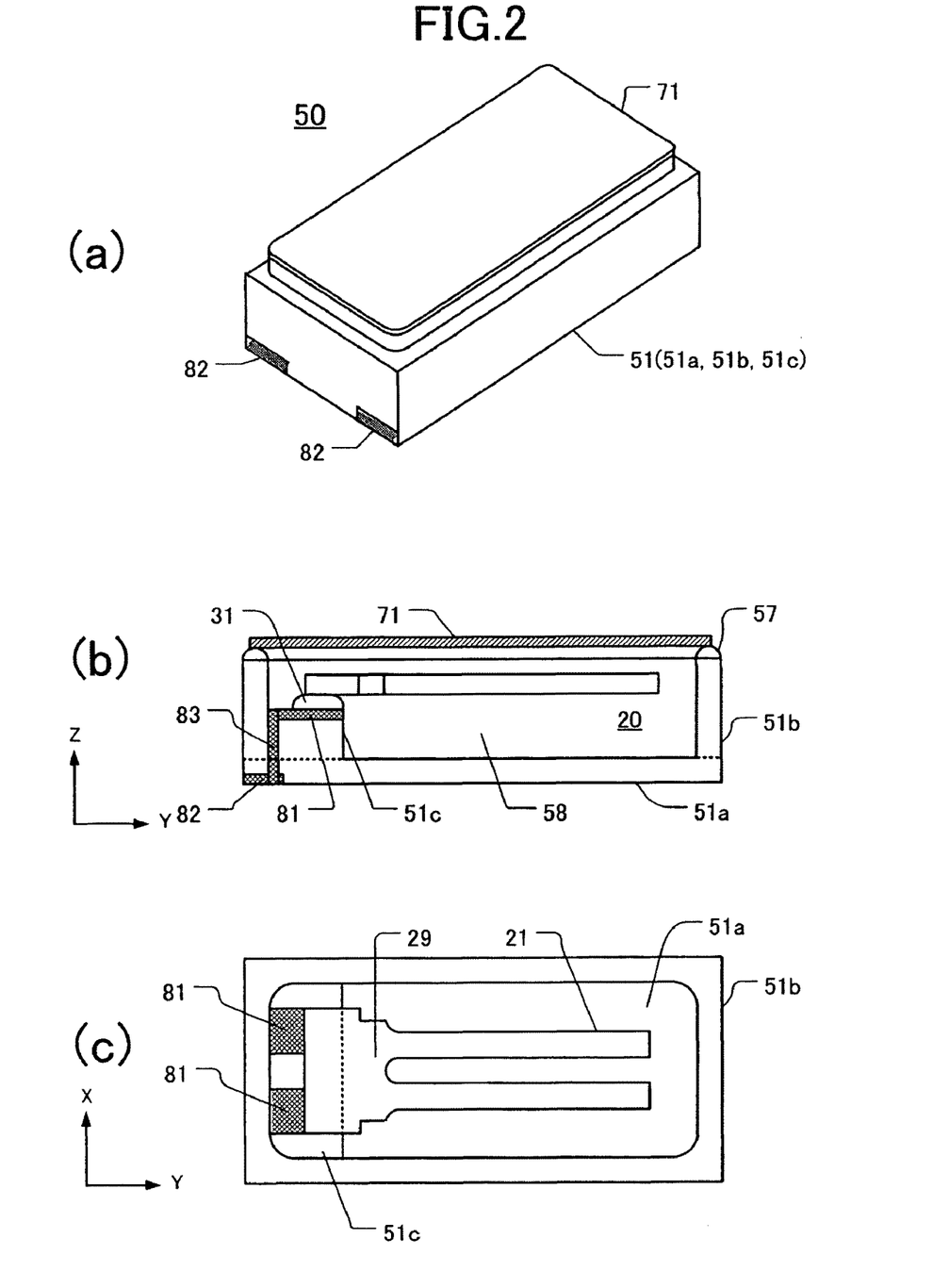

An embodiment of a piezoelectric crystal resonator 50 is depicted in FIGS. 2(a)-2(c), of which FIG. 2(a) is a perspective view, FIG. 2(b) is a sectional view, and FIG. 2(c) is a top view showing internal detail with the metal cap 71 removed.

The crystal resonator 50 is a surface-mounted type and comprises an insulating package 51 and a metal cap 71 that enclose interior structures of the crystal resonator 50. The package 51 desirably is made of a ceramic material. The metal cap 71 desirably is made of Kovar/nickel/cobalt. The package 51 desirably comprises a ceramic-layer bottom 51a that is press-cut from a green sheet of ceramic. The green sheet is formed from a slurry containing ceramic powder as a main material and a binder. The package 51 also includes a wall 51b and a base 51c, both desirably made of ceramic. Instead of forming the package 51 of ceramic made from ceramic powder, the package alternatively can be made from a glass ceramic made mainly from aluminum or non-shrink ceramic board. As understood from FIG. 2(b), the package 51 formed by assembling the parts 51a, 51b, 51c defines a cavity 58. A piezoelectric tuning-fork crystal vibrator 20 is mounted in the cavity 58.

The base portion 29 includes a wiring pattern having an adhesion domain that conductively connects to an electrically conductive adhesive 31. The piezoelectric tuning-fork crystal vibrator 20 is connected horizontally to the bottom 51a of the package 51 by the adhesive 31 in a manner allowing the arms of the vibrator 20 to vibrate freely. On the base 51c a wiring layer 81 conducts current to the adhesion domain of the vibrator 20.

A terminal electrode 82 defines at least two electrodes at the bottom of the package 51. These electrodes, when surface-mounted on a circuit board or the like (not shown), serve as external terminals. Also, inner wiring 83 serves to connect the wiring layer 81 electrically to the terminal electrode 82. The upper edge of the wall 51b includes a metallization layer. To connect the metal cap 71, a seal 57 comprising a low-temperature brazing metal is formed on the metallization layer. The seal 57 bonds the metal cap 71 to the top edge of the wall 51b.

Exemplary Single-Crystal Wafer

Figure 3:
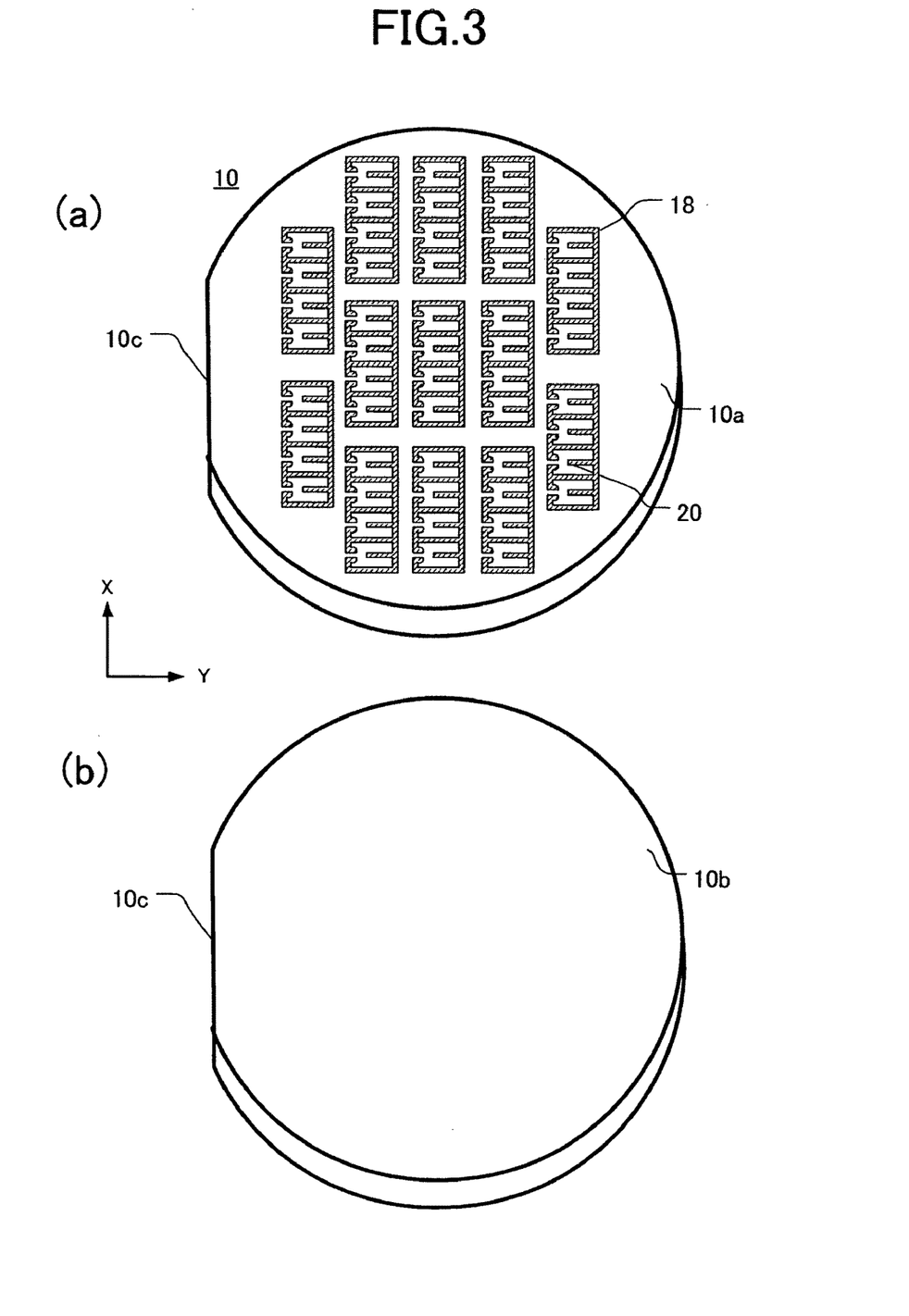
FIG. 3(a) is a top-surface perspective view of a single-crystal wafer, after development, comprising multiple piezoelectric tuning-fork vibrators formed thereon.
FIG. 3(b) is a rear-surface perspective view of the wafer shown in FIG. 3(a).

FIG. 3(a) shows a single-crystal wafer after exposure and development of a pattern defining multiple piezoelectric tuning-fork crystal vibrators. FIG. 3(a) is a perspective view of the top major surface of a piezoelectric single-crystal wafer 10 according to this embodiment, and FIG. 3(b) is a perspective view of the bottom major surface. The wafer 10 is generally round and comprises a single crystal of, for example, synthetic quartz having a thickness of 0.1 mm and a diameter of 3 to 4 inches. To identify axial and other directions on and in the wafer 10, as shown in FIG. 3(a), an orientation flat 10c is formed. The flat 10c serves as a reference for the crystal-lattice direction of the crystal, and is formed on a portion of the edge of the wafer 10.

On an actual piezoelectric single-crystal wafer 10 as shown in FIG. 3(a), normally hundreds to thousands of individual piezoelectric tuning-fork crystal vibrators 20 are formed by a process involving photolithography and wet-etching. Depending upon the degree of control of the process and the strength of the wafer, a certain number of windows 18 are formed, and multiple (typically ranging from a few dozen to about a hundred) vibrators 20 are formed in each of the windows. With respect to the wafer 10, the position of the orientation flat 10c, the positions of the windows 18, and the positions of the vibrators 20 are pre-defined. Hence, in the various processes described below, the orientation flat 10c serves as a layout and positioning reference.

FIG. 3(a) depicts a completed exposure that formed an array of piezoelectric tuning-fork crystal vibrators. It will be understood that, in this embodiment, only the "upper" major surface 10a of the wafer 10 is exposed; the rear major surface 10b is not exposed. Thus, the outlines of the vibrators 20 are formed by etching from one side of the wafer only.

Exemplary Process for Making Piezoelectric Tuning-Fork Crystal Vibrators

Figure 4:
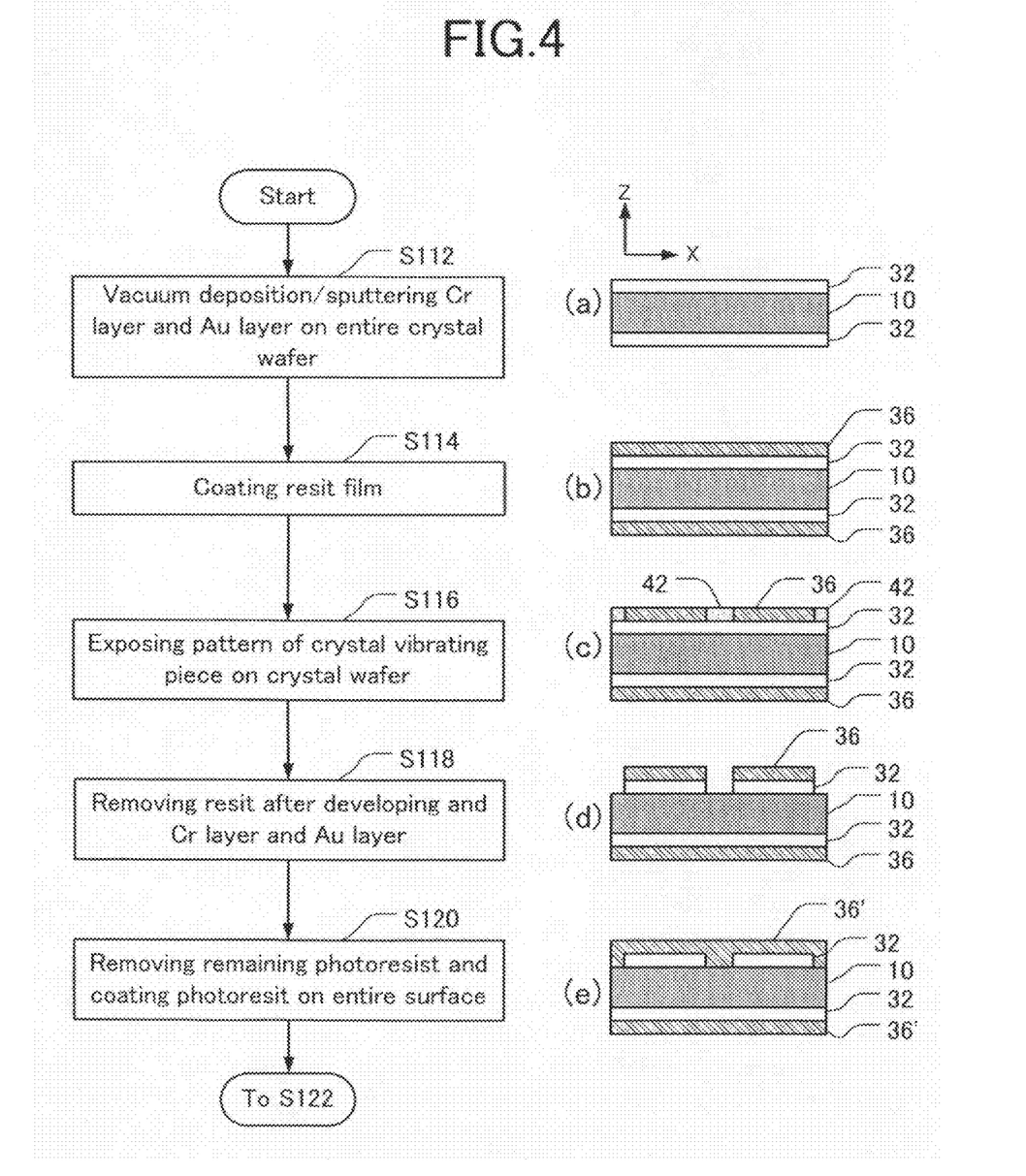
FIG. 4 is a flow chart of an embodiment of a method for forming an outline and recesses of a piezoelectric tuning-fork vibrator.
Figure 5:
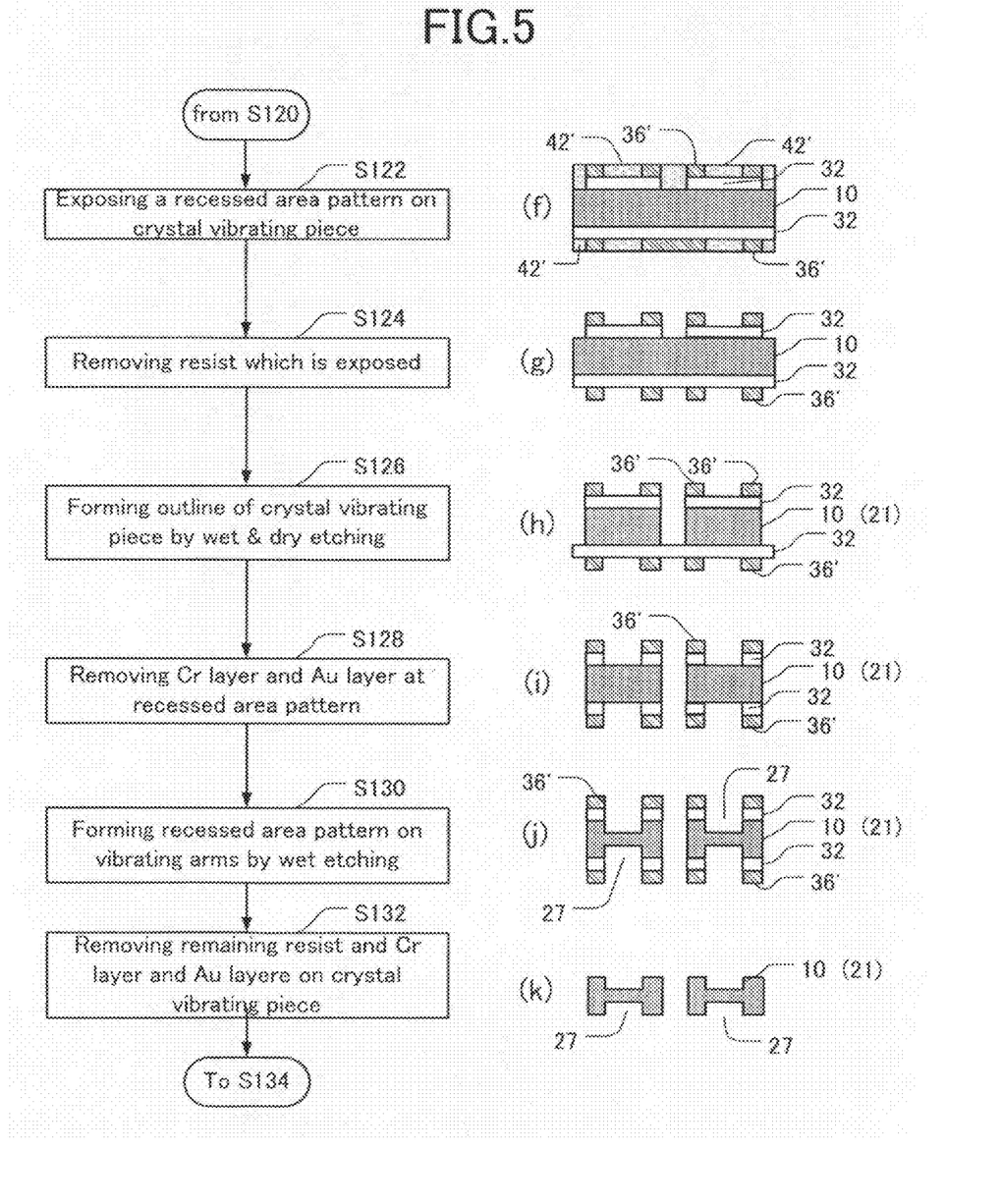
FIG. 5 is a continuation of the flow chart of FIG. 4.
Figure 6:
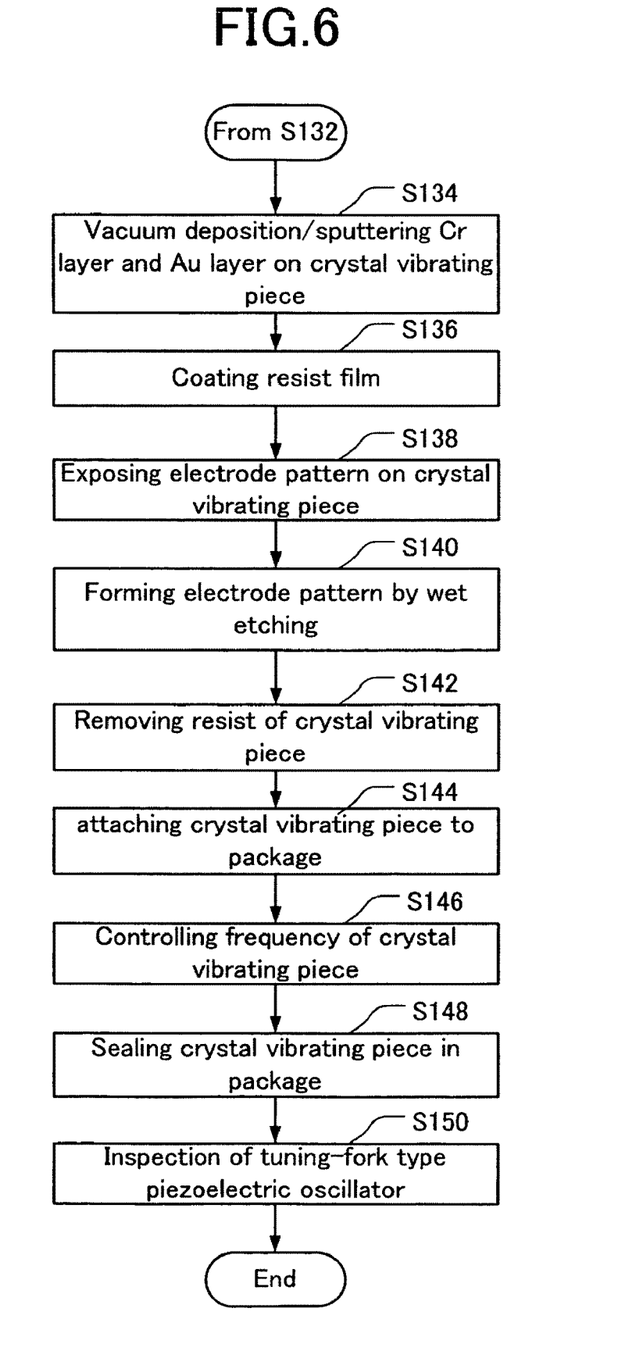
FIG. 6 is a continuation of the flow chart of FIG. 5, directed to forming an electrode pattern for the vibrator and to packaging the vibrator to produce a piezoelectric device.

FIGS. 4 and 5 are flow charts of respective portions of an embodiment of a process. The portions are directed to forming the outlines and recessed regions of piezoelectric tuning-fork crystal vibrators 20 on a single-crystal wafer 10. Cross-sections of a portion of the wafer 10, including the result of the respective step described on the left of each figure, are shown on the right in each figure. The cross-sections are of sufficient scope to depict the formation of two arms 21. FIG. 6 is a flow chart of a respective portion of the process directed to forming electrodes and to packaging.

Forming the Outline and Recesses of the Piezoelectric Tuning-Fork Crystal Vibrator Turning first to FIG. 4, in step S112 a single-crystal piezoelectric wafer 10 is prepared, and a corrosion-resistant film 32 is formed on both major surfaces of the wafer 10. The film 32 is formed by sputtering or other suitable deposition method. When forming the vibrator 20 from a single-crystal wafer 10, it is difficult to form a film of gold (Au) or silver (Ag) directly on the wafer surface for use as a corrosion-resistant film. Consequently, chrome (Cr) or titanium (Ti) is formed first on the wafer surfaces for use as a deposition substrate. That is, in this embodiment, the corrosion-resistant film 32 can be formed as a metal thin-film bilayer comprising an Au layer formed on a Cr layer. An exemplary thickness of the chrome layer is 500 Ångstroms, and an exemplary thickness of the Au layer is 1000 Ångstroms. The result of this step is shown in FIG. 4(a).

In step S114, the major surfaces of the wafer are coated with a respective layer 36 of photoresist using a technique such as spin-coating. The photoresist layer 36 extends entirely over the corrosion-resistant film 32 on both major surfaces of the wafer 10. The photoresist layer 36 can be, for example, a positive photoresist comprising novolac resin. The result of this step is shown in FIG. 4(b).

Next, in step S116, using a photolithographic exposure apparatus and an appropriate patterned reticle or mask, outline patterns of individual piezoelectric tuning-fork vibrators are imaged in the photoresist layer 36 on one surface (e.g., the upper surface, as shown) of the wafer 10. Areas of exposed photoresist are thus formed on the upper surface of the wafer. The result of this step is shown in FIG. 4(c). The exposed photoresist 42 is, in step S118, developed and removed (FIG. 4(d)), leaving only areas of undeveloped photoresist 36 defining a photomask.

In a conventional process, the imaging step (S116) would involve separately exposing the upper and lower major surfaces of the wafer 10 using a one-side exposure apparatus, or exposing both major surfaces simultaneously using a two-side exposure apparatus. If a one-side exposure apparatus is used, the wafer would need to be turned over and realigned between the exposures. As a result, the outline patterns of the piezoelectric tuning-fork vibrators 20 formed on the major surfaces of the wafer likely do not have exact registration with each other. Even if a two-side exposure apparatus is used, misalignment can occur as the photomasks are aligned with each other. In this embodiment, in contrast, only one major surface of the wafer is exposed, thereby eliminating the need to align the outlines of the piezoelectric tuning-fork vibrators on both sides of the wafer.

As noted, in step S118, the photoresist layer 36 on the upper surface of the single crystal wafer 10 is exposed, and the exposed photoresist 42 is removed. The resulting unprotected surfaces of the gold layer (of the corrosion-resistant layer 32) are etched using, for example, a solution of iodine and potassium iodide. Next, the resulting exposed surfaces of the underlying chrome layer are etched using a solution, for example, of cerium diammonium nitrate and acetic acid. To avoid over-etching, the concentration, temperature, and time of soaking of the wafer in the etching solution are controlled. Thus, selected portions of the corrosion-resistant film 32 are removed, as shown in FIG. 4(d). Note that, in FIG. 4(b), the outline pattern of the piezoelectric tuning-fork vibrators 20 appears only on the upper major surface of the wafer 10. This result is also shown in FIG. 3(a), in which the upper major surface is patterned, but the rear major surface (FIG. 3(b)) is not.

In step S120 the photoresist 36 on the remaining portions of the corrosion-resistant layer 32 of the upper surface of the wafer 10 is removed. New photoresist 36' is applied to the surfaces of the wafer by spin-coating or spraying, for example. The result of this step is shown in FIG. 4(e).

The next step, step S122, appears at the top of FIG. 5. To form the recesses 27 on the arms 21 of the vibrators 20, the patterns of the recesses 27 are exposed on the photoresist layer 36' in the regions of the arms 21. A single exposure is performed in a manner that exposes the photoresist layer 36' on both surfaces of the wafer, thereby forming corresponding regions of exposed photoresist 42'. The result of this step is shown in FIG. 5(f).

In step S124 the exposed photoresist 42' is developed and removed from the upper and lower surfaces of the wafer. As shown in FIG. 5(g), the remaining corrosion-resistant film 32 is not yet removed, and regions of unexposed photoresist 36' remain on the upper and lower major surfaces. As shown in FIG. 4(d), certain regions of the corrosion-resistant film 32 on the upper surface of the wafer 10 are already removed, revealing the outline of the tuning-fork type piezoelectric vibrating devices 20 on the upper surface of the crystal material 10. Note that the remaining corrosion-resistant film 32 in the recesses 27 is also left in place after removal of the exposed photoresist 42'.

It will be understood that, if recesses 27 are unnecessary, then steps S1120-S124 can be omitted, allowing the process to proceed from step S118 directly to step S126.

In step S126, the wafer 10 in the status shown in FIG. 5(g) is processed by wet-etching on the upper surface to form the outlines of the piezoelectric tuning-fork vibrators 20. During wet-etching, etching in the +X direction is relatively easy to accomplish due to etching anisotropy. Also as a result of etching anisotropy, each arm 21 has a hexagonal or pentagonal sectional profile as viewed in the +X direction, as shown in FIG. 8(b), not the ideal rectilinear profile shown in FIG. 1(b). Also, since etching proceeds from the upper surface in this embodiment, etching anisotropy has a significant effect. Hence, the wet-etching desirably is followed by dry-etching to etch the projecting portions. The dry-etching step increases the accuracy by which the desired cross-section of the arms can be achieved. Dry-etching also reduces surface roughness of etched surfaces. The result of this step is shown in FIG. 5(h).

Alternative etching techniques that can be employed include reactive-ion etching (RIE) or ion-beam etching. In RIE, the single-crystal wafer 10 is placed in a vacuum chamber of an RIE apparatus. After achieving the desired vacuum level, a reactant gas (e.g., $CF_4$ gas, $SF_3$ gas, or $CHF_3$ gas, etc.) is introduced to the chamber while impressing a high voltage of about 15 MHz frequency between electrodes situated in the chamber. These conditions generate a reactant-gas plasma, by which the single-crystal wafer 10 is dry-etched.

In step S128 the corrosion-resistant film 32 in the recesses 27 is removed by etching. Of the corrosion-resistant film 32, the gold layer is etched using, for example, a solution of iodine and potassium iodide. After removing the gold layer the exposed chrome layer is etched by a solution, for example, of cerium diammonium nitrate and acetic acid. The result of this step is shown in FIG. 5(i).

Next, in step S130, the wafer 10 is wet-etched to complete formation of the recesses 27. Specifically, the material of the crystal wafer 10 that has been exposed after removal of the corrosion-resistant film 32 and photoresist layer 36' is wet-etched using fluorinated acid solution. As shown in FIG. 5(j), etching is performed until approximately half the thickness of wafer remains, so as to prevent the recesses from fully penetrating the wafer thickness. Alternatively to wet-etching, the recesses 27 can be formed by dry-etching as discussed above.

Next, in step S132, the remaining photoresist 36 and corrosion-resistant film 32 are removed. The result of this step is shown in FIG. 5(k), in which the recesses 27 on the piezoelectric tuning-fork crystal vibrator 20 have been formed as desired.

Forming Electrodes

In step S134 the piezoelectric tuning-fork crystal vibrator 20 is washed using purified water. Then, a metal layer, from which an excitation electrode is formed (for later use as a driving electrode for the arms of the fork), is formed over the entire surface of the vibrator 20. The metal layer can be formed by evaporation or sputtering, and desirably comprises an Au layer on a Cr layer, as discussed above.

In step S136 a layer of photoresist is applied (e.g., by spraying) to the entire surface. Since the recesses 27 are already formed, photoresist is evenly applied to those regions as well.

In step S138 a photomask corresponding to the desired electrode pattern is prepared. Using the photomask, the single-crystal wafer 10 coated with the photoresist layer is exposed to imprint the electrode pattern in the photoresist layer. The electrode pattern is formed on both surfaces of the piezoelectric tuning-fork vibrator 20.

In step S140, the photoresist is developed, followed by removal of the exposed photoresist. The remaining photoresist, defining the electrode pattern, resists exposure to etching conditions. Thus, unprotected metal layer is etched to form the electrodes. To etch exposed gold layer, a solution of iodine and potassium iodide can be used. To etch the Cr layer, a solution of cerium diammonium nitrate and acetic acid can be used.

In step S142 the remaining photoresist is removed. Thus, excitation electrodes are formed in correct locations and have correct electrode width on the piezoelectric tuning-fork crystal vibrators 20.

Frequency Control and Packaging

The steps discussed above yield piezoelectric tuning-fork crystal vibrators 20 having the desired pattern of first electrodes 23, the desired pattern of second electrodes 25, and the desired recesses 27. In step S144, the vibrators 20 are mounted in a package 51 (desirably made of ceramic) using an electrically conductive adhesive 31. Specifically, the base portion 29 of the vibrator 20 is arranged on the electrically conductive adhesive 31 that has been applied to the wiring layer 81 and pre-cured to a semi-hardened state. Next, the adhesive 31 is fully hardened in a hardening furnace, and the vibrator 20 is attached to the terminal electrode 82.

In step S146 a laser beam is irradiated onto the edges of the arms 21 to evaporate and sublime selected portions of the arms. This manner of removing a small amount of material, as required, from the arms 21 provides an effective way to control their vibration frequency.

Next, in step S148, the package 51 containing the vibrator 20 is placed in a vacuum chamber where the cap 71 is applied to the package and sealed thereto using a sealant 57. Thus, fabrication of a piezoelectric device 50 is completed.

In step S150, operational characteristics of the piezoelectric device 50 are tested and verified to be sure the device meets specifications.

Alternative Method for Forming the Outline of the Piezoelectric Tuning-Fork Crystal Vibrator Step S126 of FIG. 5 can involve a dry-etching step. Dry-etching proceeds at a rate of less than one-tenth the rate of wet-etching, but typically does not exhibit the anisotropic etching behavior, based on crystal lattice, exhibited by wet-etching. If a wet-etching technique is used, it can be followed using a laser-trimming technique to form the sides of the arms 21 parallel to each other. During laser trimming, the laser beam can be applied to the upper and/or lower surface of the wafer.

Figure 7:
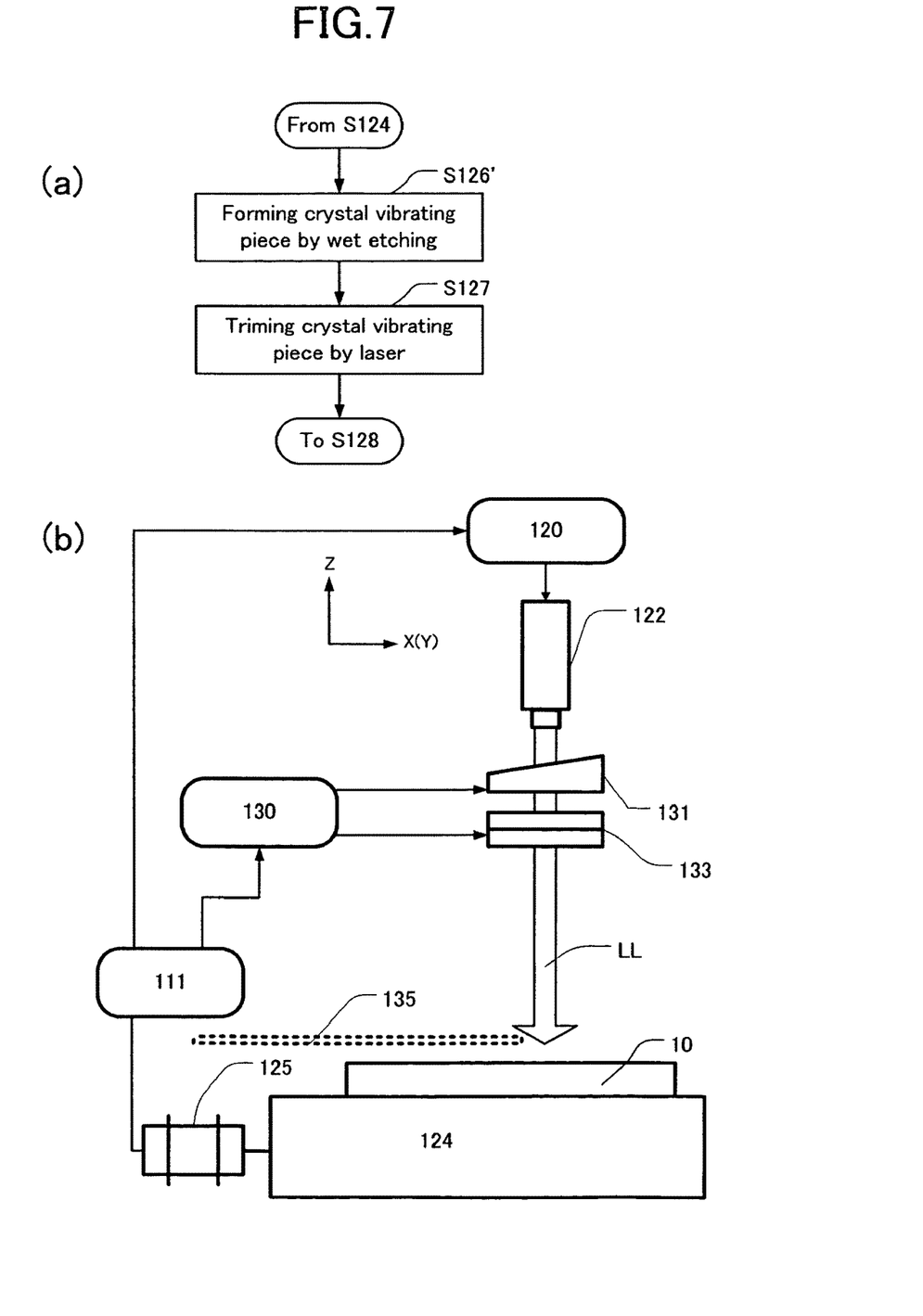
FIG. 7(a) is a flow chart of exemplary laser-processing steps that can be used instead of step 126 in FIG. 5.
FIG. 7(b) is a schematic diagram of an embodiment of an apparatus that uses a laser beam to trim (by evaporation and/or sublimation) material from the sides of the arms of a piezoelectric tuning-fork vibrator.

FIG. 7(a) is a flow-chart of the laser-trimming technique that can be used instead of the step S126 of FIG. 5. FIG. 7(b) is a schematic diagram of a configuration of a laser-trimming apparatus that can be used for removal (by evaporation or sublimation) of material from the sides of the arms 21 of the piezoelectric tuning-fork vibrator 20. Material removal is achieved by selective exposure to a laser beam LL.

In step S126', the crystal material 10 having the exposed photoresist layer 36' and corrosion-resistant film 32 is wet-etched, to form an outline of the recesses 27, using fluorinated acid solution as an etching solution. Since wet-etching proceeds in an anisotropic manner, the side surfaces of the arms 21 formed by wet-etching are not perpendicular to the upper or lower surface of the wafer.

In step S127, the laser-trimming is performed to remove crystal material selectively from the sides of the arms 21 to shape the arms perpendicularly to the upper and lower surfaces of the crystal. The laser desirably produces a pulsed beam LL having a pulse duration in the femtosecond range. Since only the arms 21 are intended to vibrate, laser-trimming is not necessary to the basal portion 29. This laser-trimming technique preceded by wet-etching is productive, has a good yield rate, and is lower in cost than laser processes applied without preliminary wet-etching.

Configuration of Laser Processing Apparatus

Laser trimming is now described with reference to FIG. 7(b), which schematically depicts an apparatus configured to remove (by evaporation and/or sublimation) material from the side surfaces of the arms 21 of the piezoelectric tuning-fork crystal vibrator 20, using the laser beam LL.

Referring again to FIG. 3(a), after wet-etching, a few thousand piezoelectric tuning-fork crystal vibrators 20 are still attached to the wafer 10 via respective joint tabs 28. Such a wafer 10 is loaded securely to a stage 124 using vacuum suction or mechanical clamps. The stage 124 is connected to a control circuit 111 that controllably actuates a motor 125 for moving the stage 124 in X and Y directions. A laser-drive circuit 120, receiving control signals from the control circuit 111, is connected to a femtosecond pulse-width laser source 122 using titan fire laser. The laser source 122 produces a pulsed laser beam LL of 760-nm wavelength at a pulse frequency of 10 KHz to 40 KHz. An X-Y driving circuit 130, also receiving control signals from the control circuit 111, drives an X optical mirror 131 and a Y optical mirror 133, both being situated in the light path of the laser beam LL. By appropriately shifting the X optical mirror 131 to an X-axis direction, the position in the X-axis direction in which the laser beam LL irradiates the arms 21 is changed. Also, by appropriately shifting the Y optical mirror 133 to a Y-axis direction, the position in the Y-axis direction in which the laser beam LL irradiates the arms 21 is changed.

Using only the X optical mirror 131 and Y optical mirror 133, no more than a particular threshold (e.g., 10 mm) of the light path of the laser beam LL can be shifted. If more shift is required, the stage 124 is moved by controllably actuating the motor 125 using the control circuit 111. If less than the threshold of shifting is required, the light path of the laser beam LL can be changed using the X optical mirror 131 and the Y optical mirror 133 as required. As the laser beam LL is moved in this manner, respective regions on the side surfaces of the arms of the vibrators 20 are trimmed. For trimming many vibrators 20 on the wafer, the laser beam LL can be scanned at high velocity without having to move the stage 124. Thus, high productivity is achieved.

Using laser irradiation 122 providing femtosecond pulse-widths, the tiny amount of mass removed from the arms 21 is processed without significant heating of the arms or of the piezoelectric tuning-fork vibrators 20. In other words, aside from performing the desired trimming, the laser beam LL does not damage or change the characteristic of the vibrators 20. Also, the laser trimming avoids imparting torsion moments to the pairs of arms 21 when the arms vibrate under actual use. Thus, the arms flexibly vibrate only in the X-direction and avoid energy loss that otherwise would result from distortion of the arms.

To avoid damaging surfaces, other than the side surfaces of the arms 21, of the vibrators 20 as they are being exposed to the laser beam LL, a protection mask 135 can be arranged as necessary. Also, instead of the femtosecond-pulse-width laser source 122, a carbon dioxide gas laser or green laser can be used.

The invention is described above in the context of representative embodiments. It will be understood by persons of ordinary skill in the relevant art that the invention also encompasses any of various changes or modifications to the described embodiments without departing from the scope of the invention. For example, instead of the materials described herein, the piezoelectric tuning-fork crystal vibrators of this invention can be fabricated from lithium niobate or any of various piezoelectric single-crystal materials instead of crystal.

In the embodiments described above in connection with FIGS. 3(a)-3(b), a single-crystal wafer 10 is used. Alternatively, a junction wafer fabricated by connecting together multiple (e.g., two) single-crystal wafers can be used. For example, a junction crystal wafer used for making piezoelectric vibrators destined for use in gyros can comprise a first crystal wafer and a second crystal wafer that are cut in the Z-axis direction. The first crystal wafer and the second crystal wafer are bonded together by a direct junction, in particular, by a siloxane junction (Si—O—Si) having a high heat resistance. To form the siloxane junction, both single-crystal surfaces of the first and the second crystal wafers are kept extremely clean until brought together. This is followed by annealing at 500° C. The present invention can be applied to such a junction crystal wafer.

Moreover, the invention is not limited to crystal resonators 50. The invention also extends to the piezoelectric tuning-fork vibrators as used in vibrating oscillators of various types. For example, an integrated circuit can be formed comprising, in the same package as that shown in FIGS. 2(a)-2(c), a driver circuit along with piezoelectric tuning-fork vibrator 20. Thus, a piezoelectric device such as a piezoelectric oscillator or real-time clock can be formed.

What is claimed is:

1. A process for making a tuning-fork type piezoelectric vibrator having at least two vibrating arms, comprising:
   forming a corrosion-resistant film on both major surfaces of a plate of piezoelectric single-crystal material having an anisotropic property;
   applying a layer of photoresist on the corrosion-resistant film on both major surfaces of the plate;
   performing a first exposure to form an outline pattern of a piezoelectric vibrator on the layer of photoresist on only one major surface of the plate;
   developing the exposed photoresist and removing regions of the corrosion-resistant film unprotected by the photoresist;
   applying a second layer of photo resist on the first and second major surfaces;
   performing a second exposure of respective second layers of photoresist on both major surfaces to form respective recessed regions on the vibrating arms;
   on only one major surface, performing a first etching of regions of the piezoelectric crystal material that are unprotected by the corrosion-resistant film; and
   performing a second etching of regions on both major surfaces of the piezoelectric material that are unprotected after removal of the corrosion-resistant film in the recessed regions.

2. The process of claim 1, wherein the first etching comprises wet-etching followed by dry-etching.

3. The process of claim 1, wherein the first etching comprises wet-etching followed by laser trimming of selected regions of side surfaces of the piezoelectric vibrator.

4. The process of claim 3, wherein laser trimming comprises irradiation of laser light after situating a protection mask on the piezoelectric vibrator.

5. The process of claim 4, wherein the laser light is pulsed, with a pulse-width in a femtosecond range.

6. The process of claim 3, wherein the laser light is pulsed, with a pulse-width in a femtosecond range.

7. The process of claim 1, wherein the second etching comprises wet-etching or dry-etching.

8. The process of claim 1, further comprising:
   removing the piezoelectric vibrator from the plate;
   forming at least one electrode on the second layers of photoresist; and
   packaging the piezoelectric vibrator.

9. The process of claim 8, wherein packaging further comprises connecting the at least one electrode for accessibility outside the packaging.

* * * * *